Figure 1:
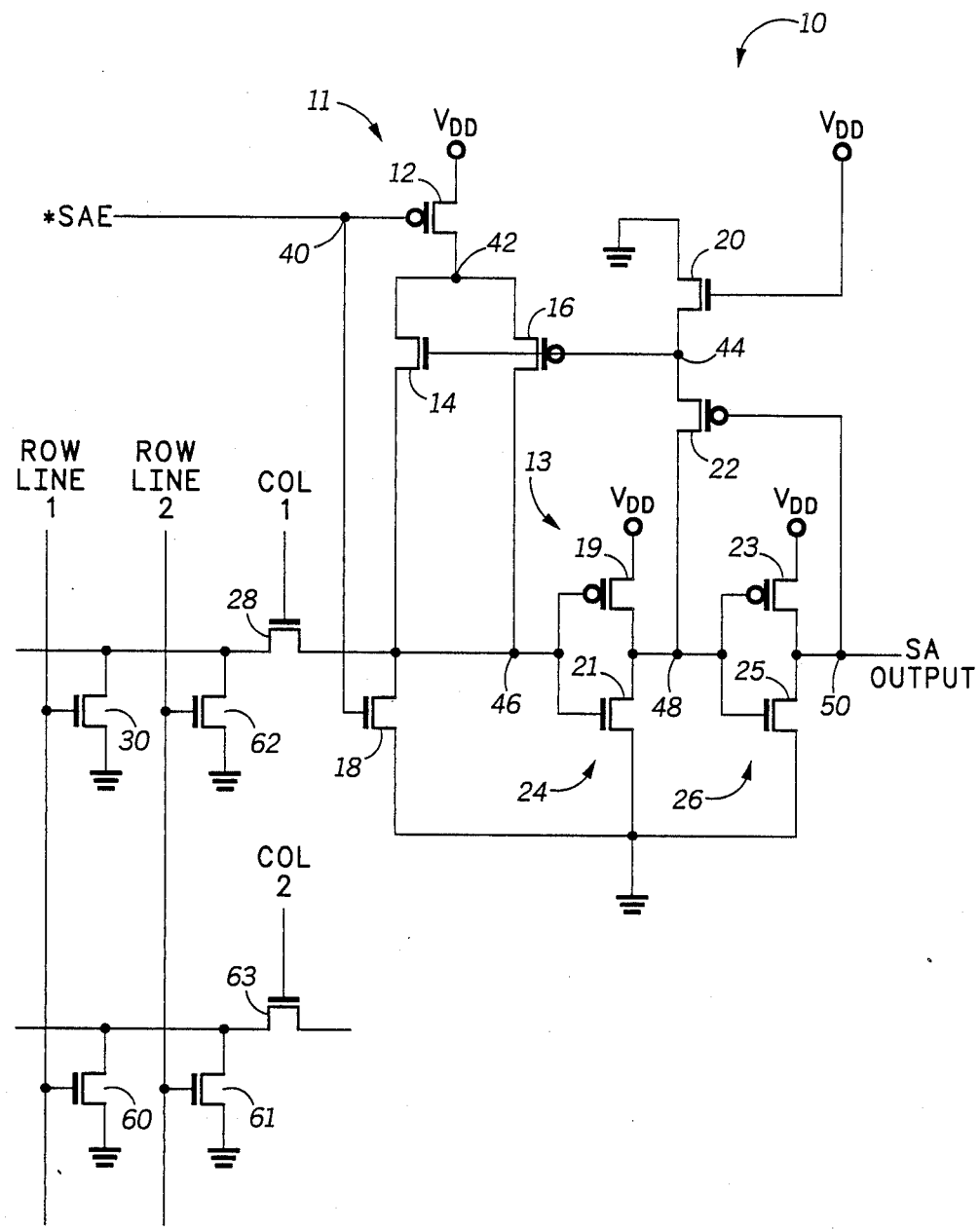

United States Patent [19]

Sood

[11] Patent Number: 4,982,363
[45] Date of Patent: Jan. 1, 1991

[54] SENSING STRUCTURE FOR SINGLE ENDED INPUT

[75] Inventor: Lal Sood, Austin, Tex.

[73] Assignee: Motorola, Inc., Schaumburg, Ill.

[21] Appl. No.: 280,095

[22] Filed: Dec. 5, 1988

[51] Int. Cl.$^5$ .............................................. G11C 7/00
[52] U.S. Cl. .............................. 365/189.01; 365/203; 307/530
[58] Field of Search ........................... 365/189.01, 203; 307/530

[56] References Cited

U.S. PATENT DOCUMENTS 4,598,389  7/1986  Duvvury et al. .................... 365/203
4,669,063  5/1987  Kirsch ................................ 365/207

Primary Examiner—James W. Moffitt
Attorney, Agent, or Firm—Charlotte B. Whitaker

[57] ABSTRACT

A single-ended sense amplifier, for fast sensing from a precharged low condition, is provided. In the precharge mode, the amplifier discharges the sensing node to ground, and charges a bias node to a first predetermined voltage. This bias node modulates the current drive capabilities of the first and second charge transistors. Once the sense amplifier enters the sensing mode, the voltage at the bias node causes the first charge transistor to rapidly supply a substantial amount of current to the sensing node. If the selected memory cell is in the conducting state, the voltage at the sense node is discharged to ground and the amplifier output is a low-voltage, indicating the detection of a logic "0" state. Conversely, if the selected memory cell is in a non-conducting state, the voltage at the sense node increases beyond a second predetermined voltage, and the amplifier output is a high-voltage, indicating the detection of a logic "1". The amplifier design eliminates the requirement for depletion mode transistors and the typical precharge/discharge scheme associated with there use. Accordingly, the self-biased sensing structure optimizes sensing speed, while reducing the power consumption of the amplifier.

7 Claims, 1 Drawing Sheet

SENSING STRUCTURE FOR SINGLE ENDED INPUT

FIELD OF THE INVENTION

This invention relates generally to a sensing circuit for a memory or microprocessor, and more particularly, to single-ended sense amplifiers.

BACKGROUND OF THE INVENTION

Single-ended sense amplifiers are widely used in memory and microprocessor circuits for reading (sensing) the logic state of memory cells. In a conventional memory circuit, the memory cells are configured as an array of rows and columns, wherein the presence or absence of a transistor in a memory cell represents the stored bit at the respective memory cell location. The sense amplifier, coupled to the column of the memory cell to be read, detects whether the memory is in a conducting or non-conducting state. If the selected memory cell in the column is in a conducting state, the sense amplifier detects a logic "0", and conversely, the sense amplifier detects a logic "1" when the memory cell is in a non-conducting state.

High-performance microprocessors, utilizing on-chip ROMs for storage of operational information, require high-speed sense amplifiers for fast sensing of data. In many cases, these high-performance microprocessor designs use on-chip ROMs with numerous output lines. While fast sensing is particularly desirable in these microprocessor environments, efficient utilization of chip area and reduction of the power consumption attributable to the amplifier are also design goals. Some amplifiers designed for use in microprocessor circuits employ double-ended, differential amplifiers for fast sensing of data. These double-ended sense amplifiers typically require more devices than single-ended amplifiers, and consequently the chip area required is larger. Moreover, the double-ended amplifiers generally require more DC current for their operation. Consequently, double-ended sense amplifiers are often infeasible for use in high-performance microprocessor circuits.

The implementation of single-ended sense amplifiers typically requires less chip area, therefore these amplifiers are generally more suitable for use in microprocessor circuits with on-chip memory. In the prior art there are single-ended sense amplifiers which require precharge/discharge circuitry for their operation. The precharge/discharge scheme may consume a significant amount of power, and conceivably degrades the performance of the microprocessor circuit. Furthermore, these sense amplifier designs have required depletion devices, which require additional processing steps for their fabrication.

SUMMARY OF THE INVENTION

An object of the present invention is to provide an improved sense amplifier.

Another object of the invention is to provide an improved self-biasing high-speed sense amplifier.

Yet another object of the invention to provide an improved single-ended sense amplifier which does not require depletion devices for its operation.

These and other objects of the invention are achieved in a memory circuit with a plurality of memory cells and a decoder for coupling an output of a selected memory cell to a sense node, a sense amplifier for sensing the logic state of said output, comprising a precharger for precharging the sense node to a power supply terminal; a buffer for detecting the logic state at the sense node, and providing an output signal which corresponds to the logic state at the sense node; a charger, having an impedance for coupling the sense node to a second power supply terminal in response to the precharge signal being in a second logic state; a feedback circuit coupled to the charger, and to the buffer for adjusting the impedance on the charger, in response to the output signal.

DESCRIPTION OF THE INVENTION

Shown in FIG. 1 is a single-ended sense amplifier 10, according to a preferred embodiment of the present invention, comprised generally of a precharge portion 11, and a sensing portion 13. Precharge portion 11 comprises p-channel transistors 12, 16, and 22, n-channel transistors 14, 18 and 20. Sensing portion 13 comprises inverters 24 and 26. Inverter 24 comprises a p-channel transistor 19 and an n-channel transistor 21. Inverter 26 comprises a p-channel transistor 23 and an n-channel transistor 25. Sense amplifier 10 is coupled to a matrix of memory cells, represented by n-channel transistors 30, 60, 61, and 62. N-channel transistors 28 and 63 function as decoders to determine which memory cell in the matrix is accessed.

Transistor 12 has a source connected to a positive power supply terminal $V_{DD}$, a drain connected to node 42, and a gate for receiving an input sense amplifier enable signal (SAE). Transistor 14 has a source connected to the drain of transistor 12, a gate connected to node 44, and a drain. Transistor 16 has a source connected to the drain of transistor 12, a gate connected to node 44, and a drain connected to a node 46 which is an input of inverter 24. Transistor 18 has a drain connected to the drain of transistor 14, a gate for receiving input signal *SAE, and a source connected to ground. Transistor 19 has a source connected to $V_{DD}$, a gate connected to node 46, and a drain. Transistor 21 has a source connected to ground, a gate connected to node 46, and a drain connected to the drain of transistor 19, for providing the output of inverter 24. Transistor 20 has a drain connected to node 44, a gate connected to $V_{DD}$, and a source connected to ground. Transistor 22 has a drain connected to a node 44, a source and a gate. Transistor 23 has a source connected to $V_{DD}$, a gate connected to node 48, and a drain. Transistor 25 has a source connected to ground, a gate connected to node 48, and a drain connected to the drain of transistor 23, for providing the output of inverter 26.

Amplifier 10 is designed to sense data from read only memory (ROM) arrays. In a typical ROM cell, where the absence or presence of a transistor represents a stored bit, a sense amplifier is coupled to the column of the memory cell to detect whether the memory cell is in a conducting or non-conducting state. When the memory cell is in a non-conducting state, the sense amplifier will detect a logic "1", and when the memory cell is in a conducting state, the sense amplifier will detect a logic "0". Accordingly, the absence of a transistor denotes a logic "1", and the presence of a transistor a logic "0". In the present invention, charge node 46 is an input of amplifier 10. During a pre-charge phase, signal *SAE is a logic high, therefore charge transistor 12 is non-conductive and precharge transistor 18 is conductive. Node 46, an input to inverter 24, is thus discharged to ground by transistor 18. Inverter 24 serves as a buffer driver for the load on node 48. Inverter 24 provides an output of essentially $V_{DD}$, therefore the voltage level at node 48 is a logic high during the precharge phase. Inverter 26 serves as a buffer driver for the load on node 50, and controls the logic state of transistor 22. Similarly, inverter 26 provides an output of essentially ground, therefore the voltage level at node 50 is a logic low. Consequently, p-channel feedback transistor 22 becomes conductive. Feedback transistor 22 couples the logic high output of inverter 24, at node 48, to node 44. A voltage ($V_{44}$) at node 44 is at a voltage between $V_{DD}$ and ground. By selecting the relative gains of transistor 20, 22, and the p-channel transistor 19 of inverter 24, voltage $V_{44}$ can be set to a selected value between $V_{DD}$ and ground. During precharge, the optimum voltage ($V_{46}$) at node 46 is achieved if the conductivity of n-channel transistor 14 is relatively high and the conductivity of p-channel transistor 16 is relatively low. The optimum condition is achieved when the threshold voltage of the n-channel transistor 20 ($V_{tn}$) equals the threshold voltage of the p-channel transistor 22 ($V_{tp}$). Accordingly, the voltage at node 44 is set to be $|V_{DD}-V_{tn}|$, by the division of transistors 19 and 20. Under the above conditions, transistor 14 is highly conductive, whereas, transistor 16 is slightly conductive.

After the completion of the row and column selection of the addressed memory cell, signal *SAE switches to a logic low. The relatively high voltage at $V_{44}$ causes transistor 14 to rapidly supply a substantial amount of current to charge node 46. Charge transistor 14 charges node 46 to a voltage just below the switchpoint of inverter 24. Depending upon whether there is an additional pull down on node 46, the voltage at node 46 will either remain below or increase beyond the switchpoint of inverter 24. In the case where the ROM cell is programmed to be non-conductive, there is no current drain through pass transistor 28, due to the absence of a transistor in the selected memory cell, therefore the voltage at node 46 will approach the switchpoint of inverter 24. Once inverter 24 switches, it will provide an output at node 48 which is a low voltage level. Due to the time delay between inverter 24 and inverter 26, the voltage level at node 50 remains a logic low for a short time while node 48 is switching to a logic low, therefore, transistor 22 also remains on for this short delay time. Consequently, transistor 22 passes the low voltage from node 48 to node 44, thereby causing transistor 14 to become less conductive, and charge transistor 16 more conductive. Accordingly, transistor 16 supplies current to node 46, causing the voltage at node 46 to approach $V_{DD}$. Meanwhile, inverter 26 switches the low level voltage at node 48, providing an output at node 50 which is a high-voltage level. Due to the high voltage at node 50, transistor 22 becomes less conductive. As transistor 16 supplies more current, the voltage at node 46 will continue to rise, which in turn will cause inverter 24 to switch, thereby producing a low-level voltage at node 48 and a high-level voltage at node 50. This process will continue until the voltage at node 46 is essentially $V_{DD}$ while the voltage at node 44 is essentially ground. Once the voltage at node 46 is essentially $V_{DD}$, inverter 24 will have switched, causing a low-level voltage output at node 48. Similarly, inverter 26 will have switched the low-level voltage, thereby causing node 50, the output of amplifier 10 to be a high-level voltage (essentially $V_{DD}$), indicating the detection of a logic "1" state.

In the case where the selected ROM cell, such as transistor 30 in FIG. 1, is programmed to be conductive, node 46 will be discharged to ground, due to the current drain through pass transistors 28, and the transisto at cell 30. Once the voltage level at node 46 becomes sufficiently low, inverter 24 will switch, causing a high-level voltage output at node 48. Similarly, inverter 26 will switch the high-level voltage, thereby causing node 50, the output of amplifier 10 to be a low-level voltage (essentially ground), indicating the detection of a logic "0" state.

By selecting the size ratios of transistors 14, 16, 20, and 22, while taking into account the ROM load and output load on node 50, the sizes and respective switch-points of inverters 24 and 26 are determined. Moreover, the voltage at node 44 may be adjusted, which facilitates the control of the gate to source voltage ($V_{gs}$) of transistor 14. Transistor 14 is important to the operation of amplifier 10 because initially, transistor 14 is the only device supplying current to node 46. If transistor 14 does not provide enough current, the voltage at node 46 will increase slowly, thereby causing slower sensing of the memory cell. Consequently, the gate control on transistor 14 is essential for the optimization of sensing speed.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. In a memory circuit with a plurality of memory cells and decoder means for coupling an output of a selected memory cell to a sense node, a sense amplifier for sensing the logic state of said output, comprising:
   precharge means for precharging the sense node to a power supply terminal, in response to a precharge signal being in a first logic state;
   buffer means for detecting the logic state at said sense node, and providing an output signal which corresponds to the logic state at said sense node;
   charge means having an impedance for coupling said sense node to a second power supply terminal, in response to said precharge signal being in a second logic state;
   feedback means coupled to said charge means and to said buffer means for adjusting the impedance of said charge means, in response to said output signal.

2. The sense amplifier of claim 1 wherein the enabling means is comprised of a first transistor having a control electrode connected to a first node, for receiving an input signal, a first current electrode connected to a first power supply terminal, and a second current electrode connected to a second node.

3. The sense amplifier of claim 1 wherein the charge means is comprised of:
   a first transistor having a control electrode connected to a first node, for receiving an input signal, a first current electrode connected to a first power supply terminal, and a second current electrode connected to a second node;
   a second transistor having a control electrode coupled to a third node, a first current electrode connected to the second current electrode of the first transistor, and a second current electrode;

a third transistor having a control electrode coupled to the third node, a first current electrode connected to the second current electrode of the first transistor, and a second current electrode coupled to a fourth node.

4. The sense amplifier of claim 3 wherein the precharge means is comprised of a fourth transistor having a control electrode coupled to the first node for receiving the first input signal, a first current electrode coupled to the second current electrode of the second transistor, and a third current electrode coupled to a second power supply terminal.

5. The sense amplifier of claim 4 wherein the feedback means is comprised of a fifth transistor having a control electrode coupled to the first power supply terminal, a first current electrode coupled to the second power supply terminal, and a second current electrode coupled to the control electrode of the third transistor;

a sixth transistor having a control electrode coupled to a fifth node, a first current electrode coupled to the third node, and a second current electrode.

6. The sense amplifier of claim 5 wherein the buffer means is comprised of a seventh transistor having a control electrode coupled to the fourth node, a first current electrode coupled to the first power supply terminal, and a second current electrode;

a eighth transistor having a control electrode coupled to the fourth node, a first current electrode coupled to the second current electrode of the seventh transistor, and a third current electrode coupled to the second power supply terminal;

a ninth transistor having a control electrode coupled to the the second current electrode of the sixth transistor, a first current electrode coupled to the first power supply terminal, and a second current electrode;

a tenth transistor having a control electrode coupled to the control electrode of the ninth transistor, a first current electrode coupled to the second current electrode of the ninth transistor, and a second current electrode coupled to the second power supply terminal.

7. A sense amplifier comprising:

a first transistor having a control electrode connected to a first node, for receiving an input signal, a first current electrode connected to a first power supply terminal, and a second current electrode connected to a second node;

a second transistor having a control electrode coupled to a third node, a first current electrode connected to the second current electrode of the first transistor, and a second current electrode;

a third transistor having a control electrode coupled to the third node, a first current electrode connected to the second current electrode of the first transistor, and a second current electrode coupled to a fourth node;

a fourth transistor having a control electrode coupled to the first node for receiving the first input signal, a first current electrode coupled to the second current electrode of the second transistor, and a third current electrode coupled to a second power supply terminal;

a fifth transistor having a control electrode coupled to the first power supply terminal, a first current electrode coupled to the second power supply terminal, and a second current electrode coupled to the control electrode of the third transistor;

a sixth transistor having a control electrode coupled to a fifth node, a first current electrode coupled to the third node, and a second current electrode;

a seventh transistor having a control electrode coupled to the fourth node, a first current electrode coupled to the first power supply terminal, and a second current electrode;

a eighth transistor having a control electrode coupled to the fourth node, a first current electrode coupled to the second current electrode of the seventh transistor, and a third current electrode coupled to the second power supply terminal;

a ninth transistor having a control electrode coupled to the the second current electrode of the sixth transistor, a first current electrode coupled to the first power supply terminal, and a second current electrode;

a tenth transistor having a control electrode coupled to the control electrode of the ninth transistor, a first current electrode coupled to the second current electrode of the ninth transistor, and a second current electrode coupled to the second power supply terminal.

* * * * *